(12) United States Patent
DeCook

(10) Patent No.: US 12,442,670 B2
(45) Date of Patent: Oct. 14, 2025

(54) RIGID MOUNTING CONNECTOR

(71) Applicant: ITT Manufacturing Enterprises LLC, Wilmington, DE (US)

(72) Inventor: Bradley DeCook, Victor, NY (US)

(73) Assignee: Poseidon Systems, LLC, Victor, NY (US)

( * ) Notice: Subject to any disclaimer, the term of this patent is extended or adjusted under 35 U.S.C. 154(b) by 300 days.

(21) Appl. No.: 18/032,974

(22) PCT Filed: Oct. 28, 2020

(86) PCT No.: PCT/US2020/057651
§ 371 (c)(1),
(2) Date: Apr. 20, 2023

(87) PCT Pub. No.: WO2022/093209
PCT Pub. Date: May 5, 2022

(65) Prior Publication Data
US 2023/0400335 A1    Dec. 14, 2023

(51) Int. Cl.
*G01D 11/30* (2006.01)
*H05K 1/18* (2006.01)

(52) U.S. Cl.
CPC ............... *G01D 11/30* (2013.01); *H05K 1/18* (2013.01); *H05K 2201/10151* (2013.01); *H05K 2201/10409* (2013.01)

(58) Field of Classification Search
CPC ............. G01D 11/30; H05K 1/18; H05K 2201/10151; H05K 2201/10409
See application file for complete search history.

(56) References Cited

U.S. PATENT DOCUMENTS

| 5,735,698 A | 4/1998 | Bakker et al. |
| 6,394,820 B1 | 5/2002 | Palaniappa et al. |

(Continued)

FOREIGN PATENT DOCUMENTS

| CN | 208169891 U | 11/2018 |
| CN | 209938937 U | 1/2020 |

(Continued)

OTHER PUBLICATIONS

International Preliminary Report on Patentability issued in corresponding International Patent Application No. PCT/US2020/057651 dated May 2, 2023.

(Continued)

*Primary Examiner* — Jamel E Williams

(57) ABSTRACT

Technologies are described for rigid mounting connectors to connect a monitoring device to a piece of equipment. The rigid mounting connectors may comprise a base and a column. The column may be tubular in shape and include a bolt opening configured to receive a threaded end of a bolt. The base may extend axially from and be attached to outside walls of the column. A length of the column may be perpendicular to the base and the column may be at a center of the base. The base may include cylinders positioned on a circle concentric to a center of the bolt opening. Each screw channel may be configured to receive a screw to fasten at least one printed circuit board assembly to a top side of the base. The base may include footings which may protrude out from a bottom side of each cylinder.

20 Claims, 6 Drawing Sheets

(56) References Cited

U.S. PATENT DOCUMENTS

| | | | |
|---|---|---|---|
| 2004/0242030 A1* | 12/2004 | Palaniappa | H01L 23/4006 |
| | | | 257/E23.084 |
| 2006/0054802 A1* | 3/2006 | Johnston | G02B 27/62 |
| | | | 250/239 |
| 2019/0003631 A1 | 1/2019 | Hung | |

FOREIGN PATENT DOCUMENTS

| | | | | |
|---|---|---|---|---|
| DE | 102009045557 A1 * | 4/2011 | | G01D 11/245 |
| KR | 100730619 B1 * | 6/2007 | | |

OTHER PUBLICATIONS

International Search Report in corresponding International Patent Application No. PCT/US2020/057651 dated Jan. 27, 2021.

Office Action dated Jan. 24, 2025 issued by the China National Intellectual Property Administration in Chinese Patent Application No. 202080106646.1 (17 pages).

* cited by examiner

RIGID MOUNTING CONNECTOR

BACKGROUND

Unless otherwise indicated herein, the materials described in this section are not prior art to the claims in this application and are not admitted to be prior art by inclusion in this section.

A sensor device may be used to monitor a piece of equipment such as a pump or vibrating machine. A mounting connector may be used to connect the sensing device to the piece of equipment. A mounting connector may securely connect the sensing device to the piece of equipment so that sensed data is accurate.

SUMMARY

One embodiment of the invention is a rigid mounting connector to connect a monitoring device to a piece of equipment. The rigid mounting connector may comprise a base. The rigid mounting connector may comprise a column. The column may include walls which define a bolt opening through the length of the column. The bolt opening may be tubular in shape and configured to receive a threaded end of a bolt within the bolt opening. The column may be configured to receive a bolt head of the bolt. The base may extend axially from and be attached to outside walls of the column. A length of the column may be perpendicular to the base and the column may be at a center of the base. The base may include cylinders positioned on a circle concentric to a center of the bolt opening. Walls of each of the cylinders may define a screw channel with an opening on a top side of each cylinder. Each screw channel may be configured to receive a screw to fasten at least one printed circuit board assembly to a top side of the base. The base may include footings. A footing may protrude out from a bottom side of each cylinder.

Another embodiment of the invention includes a method for mounting a device to a piece of equipment. The method may comprise placing a threaded end of a bolt through a bolt opening of a column of a rigid mounting connector. The rigid mounting connector may comprise a base. The rigid mounting connector may include a column. The column may include walls which define the bolt opening through the length of the column. The bolt opening may be tubular in shape and configured to receive the threaded end of the bolt within the bolt opening. The column may be configured to receive a bolt head of the bolt. The base may extend axially from and be attached to outside walls of the column. A length of the column may be perpendicular to the base and the column may be at a center of the base. The base may include cylinders positioned on a circle concentric to a center of the bolt opening. Walls of each of the cylinders may define a screw channel with an opening on a top side of each cylinder. Each screw channel may be configured to receive a screw to fasten at least one printed circuit board assembly to a top side of the base. The base may include footings. A footing may protrude out from a bottom side of each cylinder. The method may comprise placing the footings of the rigid mounting connector upon a surface of the piece of equipment. The method may comprise aligning the threaded end of the bolt with a bolt channel of the piece of equipment. The method may comprise turning the bolt so that the threaded end of the shaft interacts and couples with threads of walls of the bolt channel to secure the rigid mounting connector to the piece of equipment. The footings of the rigid mounting connector may be in contact with the surface of the piece of equipment.

Another embodiment of the invention is a rigid mounting connector to connect a monitoring device to a piece of equipment. The rigid mounting connector may comprise a base. The rigid mounting connector may comprise a column. The column may include walls which define a bolt opening through the length of the column. The bolt opening may be tubular in shape and configured to receive a threaded end of a bolt within the bolt opening. The column may be configured to receive a bolt head of the bolt. The base may extend axially from and be attached to outside walls of the column. A length of the column may be perpendicular to the base and the column may be at a center of the base. The base may include cylinders positioned on a circle concentric to a center of the bolt opening. Walls of each of the cylinders may define a screw channel with an opening on a top side of each cylinder. Each screw channel may be configured to receive a screw to fasten at least one printed circuit board assembly to a top side of the base. The base may include footings. A footing may protrude out from a bottom side of each cylinder with an essentially rounded or hemi-spherical outer surface. The rigid mounting connector may be embedded in a base support of a device. One or more printed circuit board assemblies may be secured by screws to a top side of the rigid mounting connector. The one or more printed circuit board assemblies may include at least one of a vibration sensor, a temperature sensor, a motor flux sensor, an ultrasonic sensor, a blue tooth transmitter, and a cellular transmitter.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

Figure 1:
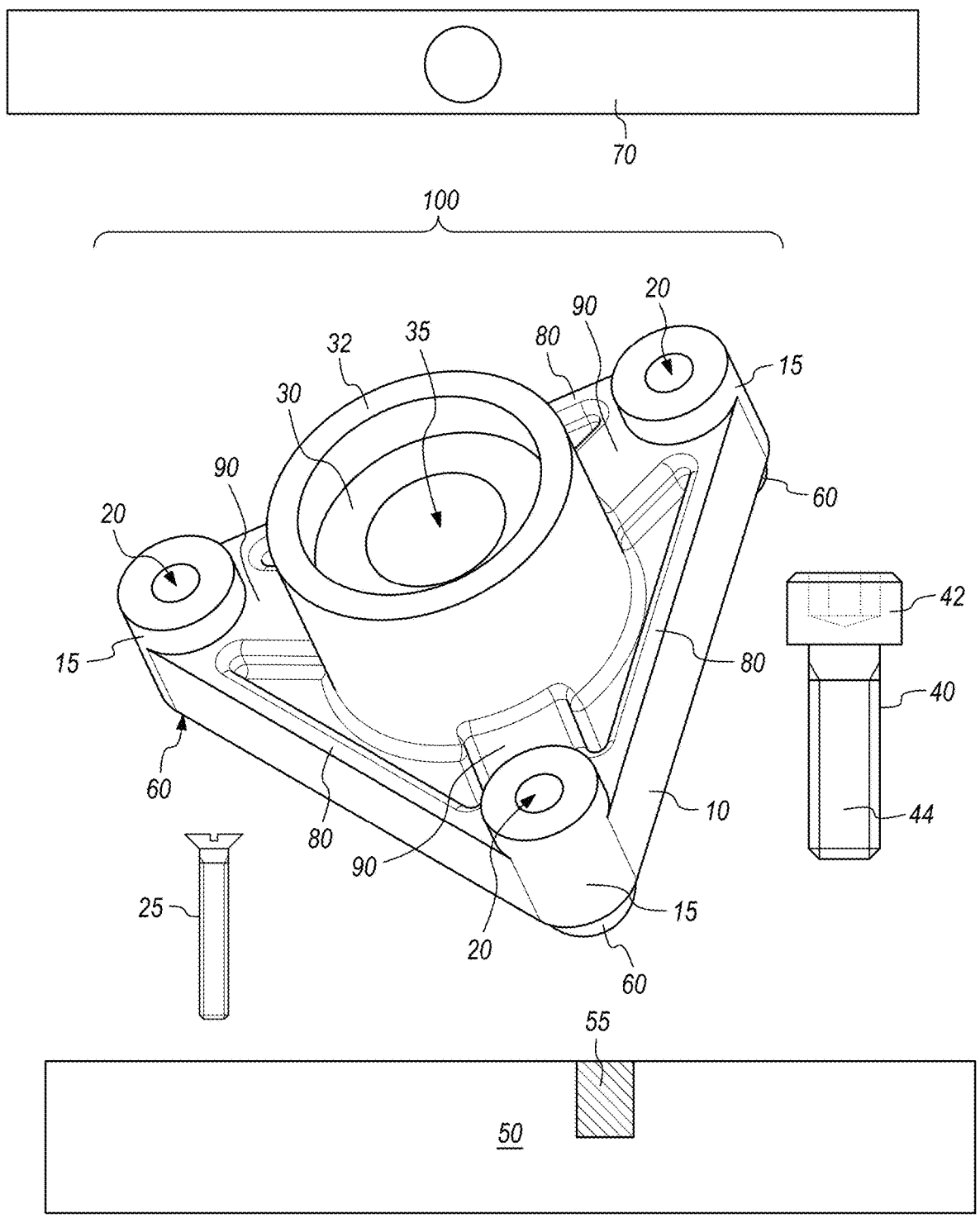
FIG. 1 is a top perspective view of a rigid mounting connector.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

FIG. 1 is a top perspective view of a rigid mounting connector, arranged in accordance with at least some embodiments described herein. Rigid mounting connector 100 may be stainless steel. Rigid mounting connector 100 may include a base 10 and a column 30. Base 10 may extend axially from and be attached to outside walls of column 30 such that a length of column 30 is perpendicular to base 10 and column 30 is at a center of base 10. Base 10 may be triangular in shape when viewed from above. Column 30 may be circular in shape when viewed from above.

Base 10 may include cylinders 15. Cylinders 15 may be positioned on a circle concentric to a center of column 30. Cylinders 15 may be at each of three corners of triangular base 10. Triangular base 10 may be an equilateral triangle with all three sides of base 10 equivalent in length. Walls of each cylinder 15 may define a mount screw channel 20 with an opening on a top side of each cylinder 15. Each mount screw channel 20 may be configured so that a screw, such as screw 25, may be received within screw channel 20. Screw 25 may threadedly interact with threads of walls of mount screw channel 20 to secure screw 25 to mount screw channel 20. Each mount screw channel 20 may receive a respective screw 25 and collectively, screws 25 may secure a printed circuit board assembly (PCBA) 70 to a top side of base 10 of rigid mounting connector 100.

Base 10 may include cross supports 80 between adjacent cylinders 15. Base 10 may include cross supports 90 between each cylinder 15 and column 30. Cross supports 80 and 90 may increase a rigidity of base 10 and rigid mounting connector 100. Cross supports 80 and 90 may keep a natural frequency of rigid mounting connector 100 above a frequency range of a vibration sensor (accelerometer). For example, a natural frequency of the rigid mounting connector 100 may be greater than 20 kHz. when the frequency bandwidth of a vibration sensor is 3 Hz.-5 kHz.). A footing 60 may protrude out from a bottom side of each cylinder 15 of base Footings 60 may be positioned on a circle concentric to a center of column 30.

Column 30 may include walls which may define a bolt opening 35 through the length of column 30. Bolt opening 35 may be tubular in shape and configured so that a threaded shaft 44 of a bolt 40, may be received within bolt opening 35. Cylinders 15 and footings 60 protruding from cylinders 15 may be positioned on a circle concentric to a center of bolt opening of column 30. Column 30 may include a rim 32 which may project out from a top surface of column 30.

Rim 32 may be configured to receive a bolt head 42 of bolt 40. Rim 32 may be tubular in shape and may have a diameter larger than bolt opening 35. Bolt 40 may include bolt head 42 and threaded shaft 44. Threaded shaft 44 may have a diameter which may fit within bolt opening 35. Bolt head 42 may have a diameter larger than diameter of threaded shaft 44 and may not fit within bolt opening 35. Bolt head 42 may fit within diameter of rim 32. Threaded shaft 44 may be placed through bolt opening 35. Rigid mounting connector 100 may be placed upon a surface of a piece of equipment 50 to be monitored with footings 60 in contact with the surface of a piece of equipment 50. Threaded shaft 44 may be aligned with a bolt channel 55 of a piece of equipment 50. Bolt 40 may be turned so that an end of threaded shaft 44 may threadedly interact with threads of walls of bolt channel 55 of a piece of equipment 50. Bolt 40 may be turned so that threaded shaft 44 couples with threads of walls of the bolt channel 55 of equipment 50 until bolt head 42 is within rim 32 and compressed against top surface of column 30 so that rigid mounting connector 100 is secured to piece of equipment 50.

Footings 60, protruding out from a bottom side of each cylinder 15 of base 10 may be in contact with an outer surface of equipment 50. The three footing configuration of rigid mounting connector 100 may insure a stable mounting connection between a device of rigid mounting connector 100 and equipment 50. The three footing configuration of rigid mounting connector 100 may constrain movement of a sensing apparatus secured to an outer surface of equipment 50 in six degrees of freedom.

Figure 2:
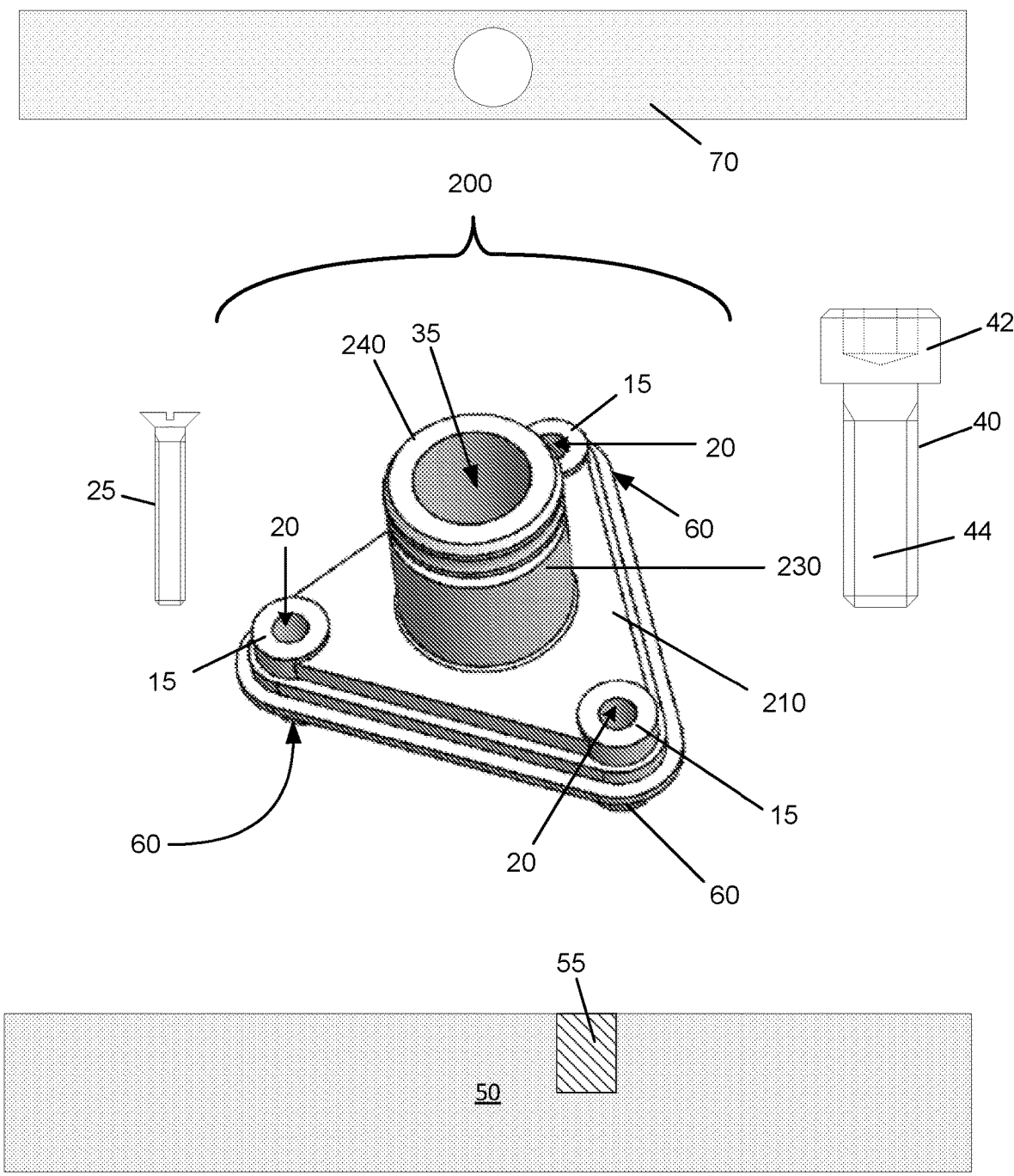
FIG. 2 is a top perspective view of a rigid mounting connector.

FIG. 2 is a top perspective view of a rigid mounting connector, arranged in accordance with at least some embodiments described herein. Those components in FIG. 2 that are labeled identically to components of FIG. 1 will not be described again for the purposes of brevity. Rigid mounting connector 200 may be stainless steel. Rigid mounting connector 200 may include a base 210 and a column 230. Base 210 may extend axially from and be attached to outside walls of column 230 such that a length of column 230 is perpendicular to base 210 and column 230 is at a center of base 210. Column 230 may be circular in shape when viewed from above.

Base 210 may include cylinders 15. Cylinders 15 may be positioned on a circle concentric to a center of column 230. Base 210 may be any shape such that cylinders are positioned on a circle concentric to a center of column 230. Cylinders 15 may be positioned on a circle concentric to a center of column 230 at each of three corners of a triangular base 210. Base 210 may be an equilateral triangle with all three sides of base 10 equivalent in length. Walls of each cylinder 15 may define a mount screw channel 20 with an opening on a top side of each cylinder 15. Each mount screw channel 20 may be configured so that a screw, such as screw 25, may be received within screw channel 20. Screw 25 may threadedly interact with threads of walls of mount screw channel 20 to secure screw 25 to mount screw channel 20. Each mount screw channel 20 may receive a respective screw 25 and collectively, screws 25 may secure a printed circuit board assembly (PCBA) 70 to a top side of base 10 of rigid mounting connector 100.

Base 210 may include footings 60. A footing 60 may protrude out from a bottom side of each cylinder 15 of base 10. Footings 60 may be concentric to a center of column 30.

Column 230 may include walls which may define a bolt opening 35 through the length of column 230. Cylinders 15 and footings 60 protruding from cylinders 15 may be concentric to a center of bolt opening 35 of column 230. Bolt opening 35 may be tubular in shape and configured so that a threaded shaft 44 of a bolt 40, may be received within bolt opening 35. Column 230 may include a top surface 240 of column 230.

Top surface 240 of column 230 may be configured to receive a bolt head 42 of bolt Top surface 240 of column 230 may have an outside diameter larger than bolt opening 35. Bolt 40 may include bolt head 42 and threaded shaft 44. Threaded shaft 44 may have a diameter which may fit within bolt opening 35. Bolt head 42 may have a diameter larger than diameter of threaded shaft 44 and may not fit within bolt opening 35. Threaded shaft 44 may be placed through bolt opening 35. Rigid mounting connector 200 may be placed upon a surface of a piece of equipment 50 to be monitored with footings 60 in contact with the surface of a piece of equipment 50. Threaded shaft 44 may be aligned with a bolt channel 55 of a piece of equipment Bolt 40 may be turned so that an end of threaded shaft 44 may threadedly interact with threads of walls of bolt channel 55 of a piece of equipment 50. Bolt 40 may be turned so that threaded shaft 44 couples with threads of walls of the bolt channel 55 of equipment 50 until bolt head 42 is compressed against top surface 240 of column 230 so that rigid mounting connector 200 is secured to piece of equipment 50.

Figure 3:
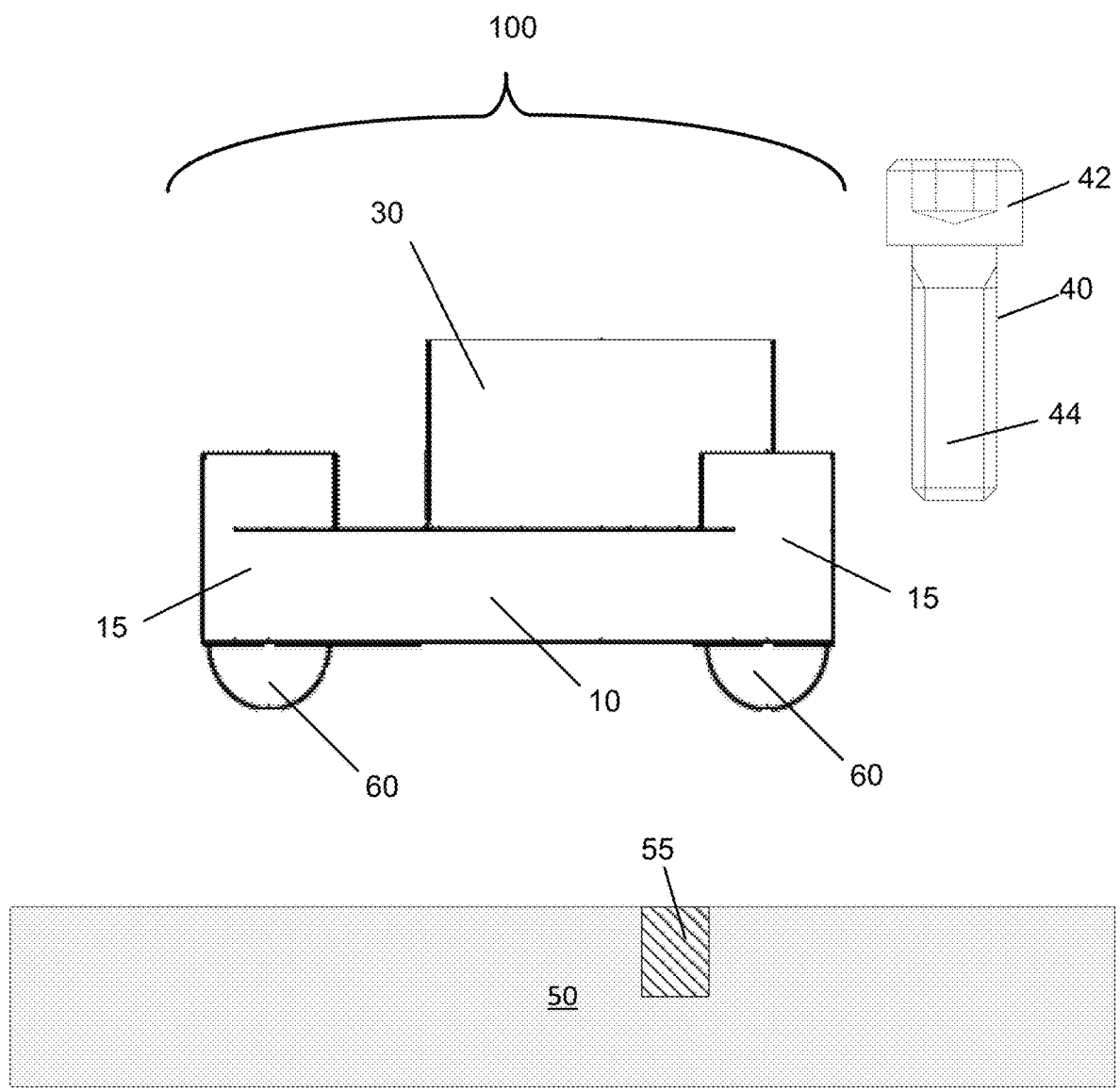
FIG. 3 is a side view of a rigid mounting connector.

FIG. 3 is a side view of a rigid mounting connector, arranged in accordance with at least some embodiments described herein. Those components in FIG. 3 that are labeled identically to components of FIG. 1-2 will not be described again for the purposes of brevity.

As shown in FIG. 3, each footing 60 may protrude out from bottom side of each cylinder 15 of base 10. Footings 60 may protrude out from bottom side of each cylinder 15 with an essentially rounded or hemi-spherical outer surface. Footings 60 may form an air gap between rigid mounting connector 100 and equipment 50 when rigid mounting connector 100 is mounted to equipment 50. Footings 60 may protrude out from bottom side of each cylinder 15 approximately 0.0625 to 0.1875 inches. Footings 60 may have a diameter of 0.100 inches to inches. Footings 60 may support a compression load exerted by mount screw 40 when mount screw 40 is torqued for adequate connection to equipment 50. Footings 60 may be comprised of a material that is rigid with high strength properties, and is a good conductor of heat. Footings 60 may be metallic material.

Figure 4:
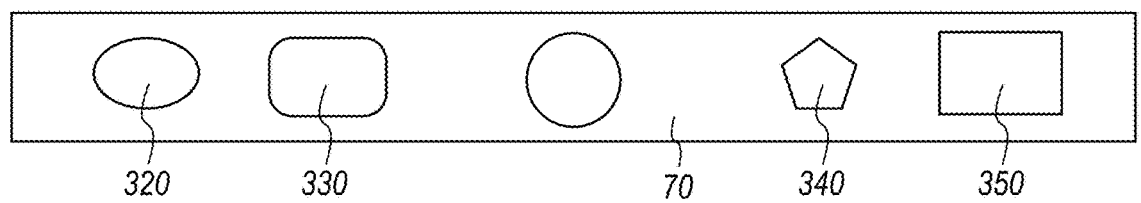
FIG. 4 is a top perspective view of a rigid mounting connector embedded in a base support of a device.
Figure 4:
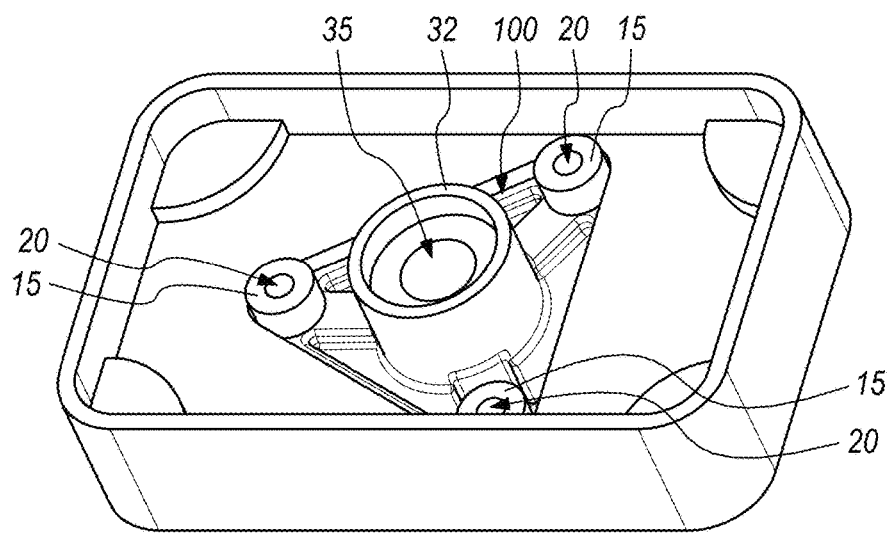
Figure 4:
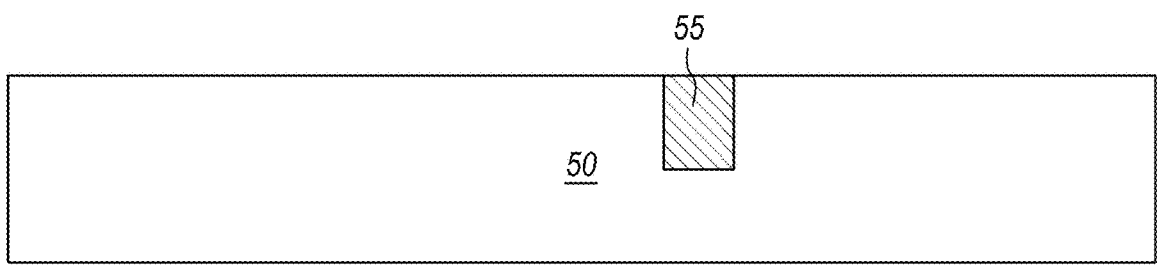

FIG. 4 is a top perspective view of a rigid mounting connector embedded in a base support of a device, arranged in accordance with at least some embodiments described herein. Those components in FIG. 4 that are labeled identically to components of FIGS. 1-3 will not be described again for the purposes of brevity.

Rigid mounting connector 100 may be embedded in a base support 310 of a device. The device may be a modular sensing device. Rigid mount connector 100 may be embedded within base support 310 of a device so that bolt opening 35 is at a center point of base support 310. Base support 310 may be over molded around rigid mount connector 100. Base support 310 may be a thermoplastic polymer material. One or more printed circuit board assemblies 70, including components such as sensors 320, electronics 330, transmitters 340, and/or processors 350 attached to the one or more printed circuit board assemblies 70 may be mounted to a top side of rigid mounting connector embedded within base support 310. Sensors 320 may include a vibration sensor, a temperature sensor, a motor flux sensor, and/or an ultrasonic sensor. Vibration and temperature sensors 320 may be located right next to attachment points of circuit board assembly 70 to rigid mounting connector 100 so as to provide a direct path of both vibration & temperature from equipment 50 to sensors 320 and may greatly improve vibration measurement accuracy and temperature sensing accuracy. Electronics 330 may include electronic connectors, resistors, capacitors, boost/buck convectors, fuses, etc. Transmitters 340 may include a blue tooth transmitter and/or a cellular transmitter. When mounted on equipment rigid mount connector 100 may provide a rigid connection between equipment 50 and components of a device including rigid mounting connector 100.

Figure 5:
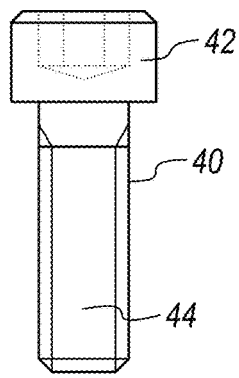
FIG. 5 is a bottom perspective view of a rigid mounting connector embedded in a base support of a device.
Figure 5:
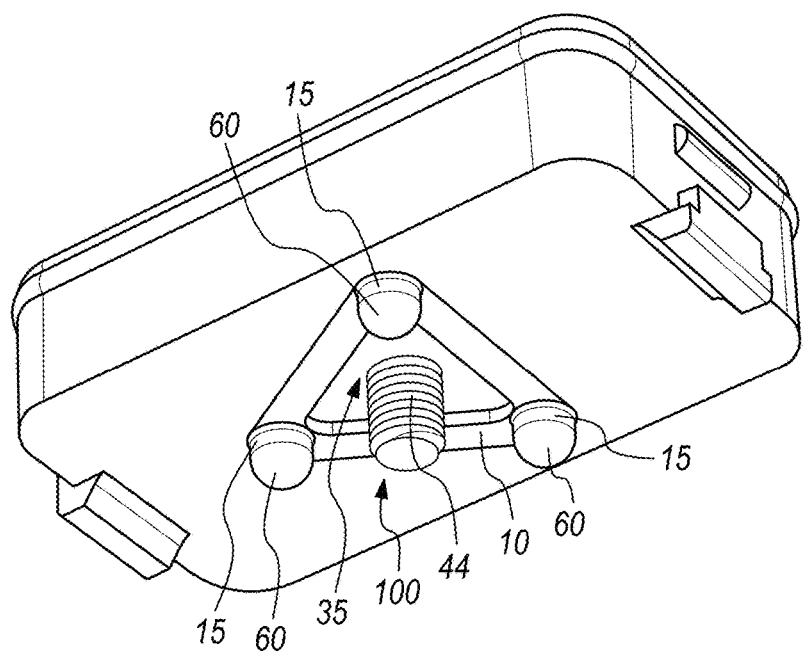
Figure 5:
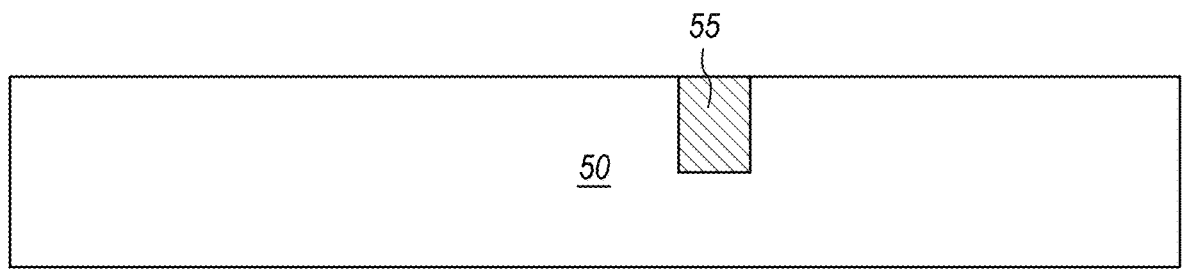

FIG. 5 is a bottom perspective view of a rigid mounting connector embedded in a base support of a device, arranged in accordance with at least some embodiments described herein. Those components in FIG. 5 that are labeled identically to components of FIGS. 1-4 will not be described again for the purposes of brevity.

As shown in FIG. 5, threaded shaft 44, having been placed through bolt opening 35 may project out from rigid mounting connector 100. An end of threaded shaft 44 may be aligned with and threadedly interacted with threads of walls of bolt channel 55 of equipment 50. Bolt 40 may be turned so that threaded shaft 44 couples with threads of walls of the bolt channel 55 of equipment 50 until bolt head 42 compresses against top surface of column 30 and secures rigid mounting connector 100 to piece of equipment 50.

Footings 60 may protrude out from a bottom side of each cylinder 15 of base 10 in a three footing triangular configuration. Footings 60 may be in contact with an outer surface of equipment 50 when rigid mounting connector 100 is secured to piece of equipment 50. Footings 60 may form an air gap between rigid mounting connector 100 and equipment 50 when rigid mounting connector 100 is mounted to equipment 50. The three footing configuration of rigid mounting connector 100 may insure a stable mounting connection between a device of rigid mounting connector 100 and equipment 50. The three footing configuration of rigid mounting connector 100 may constrain movement of a sensing apparatus secured to an outer surface of equipment 50 in six degrees of freedom.

A device in accordance with the present disclosure may provide a rigid connection to equipment for optimized vibration detection. A device in accordance with the present disclosure may provide a rigid connection to equipment with increased mount strength when compared to other mounts. A device in accordance with the present disclosure may provide a rigid mounting connector for components of a sensing device, such as one or more printed circuit board assemblies 70, including components such as sensors, electronics, transmitters, and/or processors. A device in accordance with the present disclosure may provide a rigid connection to equipment with a rigidity that provides the ability to detect high frequency vibration without any resonance such as mechanical vibrational noise. A device in accordance with the present disclosure may provide a rigid connection to equipment with footings in direct contact to the equipment and provide a superior measurement of the equipment's surface temperature.

Figure 6:
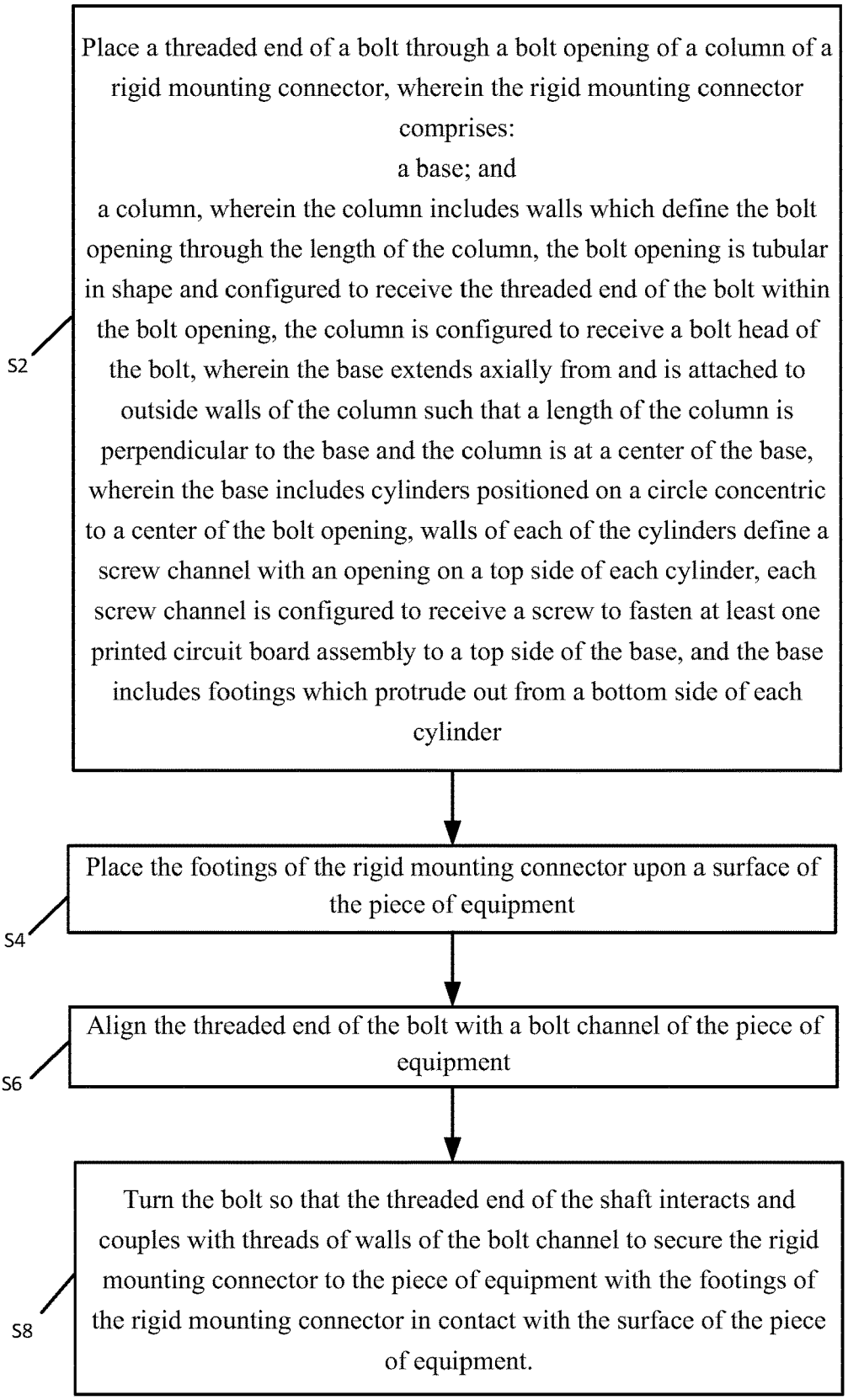
FIG. 6 illustrates a flow diagram for an example process to mount a device that includes a rigid mounting connector, all arranged according to at least some embodiments described herein.

FIG. 6 illustrates a flow diagram for an example process to mount a device that includes a rigid mounting connector, arranged in accordance with at least some embodiments presented herein. An example process may include one or more operations, actions, or functions as illustrated by one or more of blocks S2, S4, S6, and/or S8. Although illustrated as discrete blocks, various blocks may be divided into additional blocks, combined into fewer blocks, or eliminated, depending on the desired implementation.

Processing may begin at block S2, "Place a threaded end of a bolt through a bolt opening of a column of a rigid mounting connector, wherein the rigid mounting connector comprises: a base; and a column, wherein the column includes walls which define the bolt opening through the length of the column, the bolt opening is tubular in shape and configured to receive the threaded end of the bolt within the bolt opening, the column is configured to receive a bolt head of the bolt, wherein the base extends axially from and is attached to outside walls of the column such that a length of the column is perpendicular to the base and the column is at a center of the base, wherein the base includes cylinders positioned on a circle concentric to a center of the bolt opening, walls of each of the cylinders define a screw channel with an opening on a top side of each cylinder, each screw channel is configured to receive a screw to fasten at least one printed circuit board assembly to a top side of the base, and the base includes footings which protrude out from a bottom side of each cylinder". At block S2, a threaded end of a bolt may be placed through a bolt opening of a column of a rigid mounting connector. The rigid mounting connector may comprise a base. The rigid mounting connector may comprise a column. The column may include walls which define a bolt opening through the length of the column. The bolt opening may be tubular in shape and configured to receive a threaded end of a bolt within the bolt opening. The column may be configured to receive a bolt head of the bolt. The base may extend axially from and be attached to outside walls of the column. A length of the column may be perpendicular to the base and the column may be at a center of the base. Walls of each of the cylinders may define a screw channel with an opening on a top side of each cylinder. Each screw channel may be configured to receive a screw to fasten at least one printed circuit board assembly to a top side of the base. The base may include footings. A footing may protrude out from a bottom side of each cylinder.

Processing may continue from block S2 to block S4, "Place the footings of the rigid mounting connector upon a surface of the piece of equipment". At block S4, the footings of the rigid mounting connector may be placed upon a surface of the piece of equipment.

Processing may continue from block S4 to block S6, "Align the threaded end of the bolt with a bolt channel of the piece of equipment". At block S6, the threaded end of the bolt may be aligned with a bolt channel of the piece of equipment.

Processing may continue from block S6 to block S8, "Turn the bolt so that the threaded end of the shaft interacts and couples with threads of walls of the bolt channel to secure the rigid mounting connector to the piece of equipment with the footings of the rigid mounting connector in contact with the surface of the piece of equipment". At block S8, the bolt may be turned so that the threaded end of the shaft interacts and couples with threads of walls of the bolt channel. The bolt may secure the rigid mounting connector to the piece of equipment. The footings of the rigid mounting connector may be contact with the surface of the piece of equipment.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A rigid mounting connector to connect a monitoring device to a piece of equipment, the rigid mounting connector comprising:
   a base; and
   a column, wherein the column includes walls which define a bolt opening through the length of the column, the bolt opening is tubular in shape and configured to receive a threaded end of a bolt within the bolt opening, the column is configured to receive a bolt head of the bolt, wherein the base extends axially from and is attached to outside walls of the column such that a length of the column is perpendicular to the base and the column is at a center of the base, wherein the base includes cylinders positioned on a circle concentric to a center of the bolt opening, walls of each of the cylinders define a screw channel with an opening on a top side of each cylinder, each screw channel is configured to receive a screw to fasten at least one printed circuit board assembly to a top side of the base, and the base includes footings which protrude out from a bottom side of each cylinder.

2. The rigid mounting connector of claim 1, wherein the base is in the shape of a triangle with three sides of the base equivalent in length and the footings constrain movement of the mounting connector in six degrees of freedom when the mounting connector is mounted to the piece of equipment.

3. The rigid mounting connector of claim 1, wherein the footings protrude out from bottom side of each cylinder with an essentially rounded or hemi-spherical outer surface.

4. The rigid mounting connector of claim 1, wherein the footings protrude out from bottom side of each cylinder 0.0625 to 0.1875 inches.

5. The rigid mounting connector of claim 1, wherein the footings have a diameter of inches to 0.300 inches.

6. The rigid mounting connector of claim 1, wherein:
   the rigid mounting connector is metallic material;
   the rigid mounting connector is embedded in a base support of a device; and
   the base support is plastic.

7. The rigid mounting connector of claim 1, wherein the base further includes cross supports between adjacent cylinders.

8. The rigid mounting connector of claim 1, wherein the base further includes cross supports between each cylinder and the column.

9. The rigid mounting connector of claim 1, wherein one or more printed circuit board assemblies is secured by screws to a top side of the rigid mounting connector and the one or more printed circuit board assemblies include at least one of a vibration sensor, a temperature sensor, a motor flux sensor, and an ultrasonic sensor.

10. The rigid mounting connector of claim 9, wherein the one or more printed circuit board assemblies include at least one of a blue tooth transmitter and a cellular transmitter.

11. A method for mounting a device to a piece of equipment, the method comprising:
   placing a threaded end of a bolt through a bolt opening of a column of a rigid mounting connector, wherein the rigid mounting connector comprises:
   a base; and
   a column, wherein the column includes walls which define the bolt opening through the length of the column, the bolt opening is tubular in shape and configured to receive the threaded end of the bolt within the bolt opening, the column is configured to receive a bolt head of the bolt, wherein the base extends axially from and is attached to outside walls of the column such that a length of the column is perpendicular to the base and the column is at a center of the base, wherein the base includes cylinders positioned on a circle concentric to a center of the bolt opening, walls of each of the cylinders define a screw channel with an opening on a top side of each cylinder, each screw channel is configured to receive a screw to fasten at least one printed circuit board assembly to a top side of the base, and the base includes footings which protrude out from a bottom side of each cylinder;

placing the footings of the rigid mounting connector upon a surface of the piece of equipment;

aligning the threaded end of the bolt with a bolt channel of the piece of equipment; and turning the bolt so that the threaded end of the shaft interacts and couples with threads of walls of the bolt channel to secure the rigid mounting connector to the piece of equipment with the footings of the rigid mounting connector in contact with the surface of the piece of equipment.

12. The method of claim 11, wherein:

the bolt includes a bolt head with a diameter larger than a diameter of the bolt shaft; and the bolt is turned until the bolt head is compressed against a top surface of the column to secure the rigid mounting connector to the piece of equipment.

13. The method of claim 11, wherein the footings of the rigid mounting connector form an air gap between the rigid mounting connector and the piece of equipment.

14. The method of claim 11, wherein the footings of the rigid mounting connector constrain movement of the mounting connector in six degrees of freedom when the mounting connector is secured to the piece of equipment.

15. The method of claim 11, wherein the footings of the rigid mounting connector protrude out from bottom side of the rigid mounting connector with an essentially rounded or hemi-spherical outer surface.

16. The method of claim 11, wherein the rigid mounting connector is embedded in a base support of a device.

17. The method of claim 11, wherein a printed circuit board assembly is mounted to a top side of the rigid mounting connector.

18. A rigid mounting connector to connect a monitoring device to a piece of equipment, the rigid mounting connector comprising:

a base; and a column, wherein the column includes walls which define a bolt opening through the length of the column, the bolt opening is tubular in shape and configured to receive a threaded end of a bolt within the bolt opening, the column is configured to receive a bolt head of the bolt, wherein the base extends axially from and is attached to outside walls of the column such that a length of the column is perpendicular to the base and the column is at a center of the base, wherein the base includes cylinders positioned on a circle concentric to a center of the bolt opening, walls of each of the cylinders define a screw channel with an opening on a top side of each cylinder, each screw channel is configured to receive a screw to fasten at least one printed circuit board assembly to a top side of the base, the base includes footings which protrude out from a bottom side of each cylinder with an essentially rounded or hemi-spherical outer surface, and the rigid mounting connector is embedded in a base support of a device;

wherein one or more printed circuit board assemblies is secured by screws to a top side of the rigid mounting connector and the one or more printed circuit board assemblies include at least one of a vibration sensor, a temperature sensor, a motor flux sensor, an ultrasonic sensor, a blue tooth transmitter, and a cellular transmitter.

19. The rigid mounting connector of claim 18, wherein:

the rigid mounting connector is metallic material;

the rigid mounting connector is embedded in a base support of a device; and the base support is plastic.

20. The rigid mounting connector of claim 18, wherein the one or more printed circuit board assemblies includes a vibration sensor and a temperature sensor and the vibration sensor and the temperature sensor are located next to a screw securing the circuit board assembly to a cylinder of rigid mounting connector to provide a direct path of vibration and temperature from the equipment to the vibration sensor and the temperature sensor.

* * * * *